(12) United States Patent
Tsironis

(10) Patent No.: US 9,835,652 B1
(45) Date of Patent: Dec. 5, 2017

(54) MULTI-FREQUENCY ATTENUATION AND PHASE CONTROLLER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 1138 days.

(21) Appl. No.: 13/896,764

(22) Filed: May 17, 2013

(51) Int. Cl.
 *G01R 1/20* (2006.01)
(52) U.S. Cl.
 CPC ..................... *G01R 1/20* (2013.01)
(58) Field of Classification Search
 CPC ......... H01L 22/34; G01S 7/023; G01R 29/26; G01R 19/0053
 USPC ........... 324/500, 520–524, 750.01, 600, 616, 324/76.11, 216, 637, 639
 See application file for complete search history.

(56) References Cited

U.S. PATENT DOCUMENTS

| | | | |
|---|---|---|---|
| 6,674,293 B1 | 1/2004 | Tsironis | |
| 7,135,941 B1 | 11/2006 | Tsironis | |
| 8,497,689 B1* | 7/2013 | Tsironis | G01R 27/32 324/637 |
| 2012/0274425 A1* | 11/2012 | Mung | H01P 1/38 333/24 R |
| 2013/0321092 A1* | 12/2013 | Simpson | H03H 11/30 333/17.3 |

OTHER PUBLICATIONS

Load Pull System, www.microwaves101.com/encyclopedia/loadpull.cfm.
S-Parameter Basics, www.microwaves101.com/encyclopedia/sparameters.cfm.
Coaxial Circulators, www.dpvrf.com/coaxial_circulators.html.
Directional Couplers, www.e-meca.com/rf-directional-coupler/directional-coupler-780.php.
Frequency Diplexers, www.markimicrowave.com/2781/diplexers.aspx.
Low Pass filters, www.markimicrowave.com/3448/Low_Pass_Filters.aspx.
MPT, a universal Multi-Purpose Tuner, Product Note 79, Focus Microwaves Inc. Oct. 2004.
Active Load Pull System, http://ieeexplore.ieee.org/xpl/freeabs_all.jsp?arnumber=1516920.
Harmonic Active Injection Load Pull, HAILP, datasheet, Focus Microwaves Inc., 2011.
Method for Calibration and Tuning with Impedance tuners, U.S. Appl. No. 12/929,643, filed Aug. 2008.
Frequency Diplexers, http://en.wikipedia.org/wiki/diplexer.
Wideband phase shifters, www.pasternack.com/phase-shifter-frequency-range-265-400-ghz-pe8249-p.aspx.

* cited by examiner

*Primary Examiner* — Melissa Koval
*Assistant Examiner* — Trung Nguyen

(57) ABSTRACT

A multi-frequency programmable and remotely controllable variable attenuator and phase shifter (MF-VAPS) network utilizes wideband three port circulators, power combiners, high-low pass filters and a calibrated multi-harmonic tuner to control the amplitude and phase of the transmission factor (A21) at up to three user defined frequencies individually. The harmonic signal components are divided in frequency bands and injected into the circulator's port 1 and extracted from port 3, whereas the tuner is connected to port 2 and terminated with Zo. When the tuner is initialized (S11=0) the transmission factor of the network is zero; when the tuner is at maximum reflection at any frequency the transmission factor is also maximum. Changing the reflection phase of the tuner controls the transmission phase <A21 by the same amount, up to 360°.

12 Claims, 14 Drawing Sheets basic amplitude/phase modulator using circulator and wideband tuner

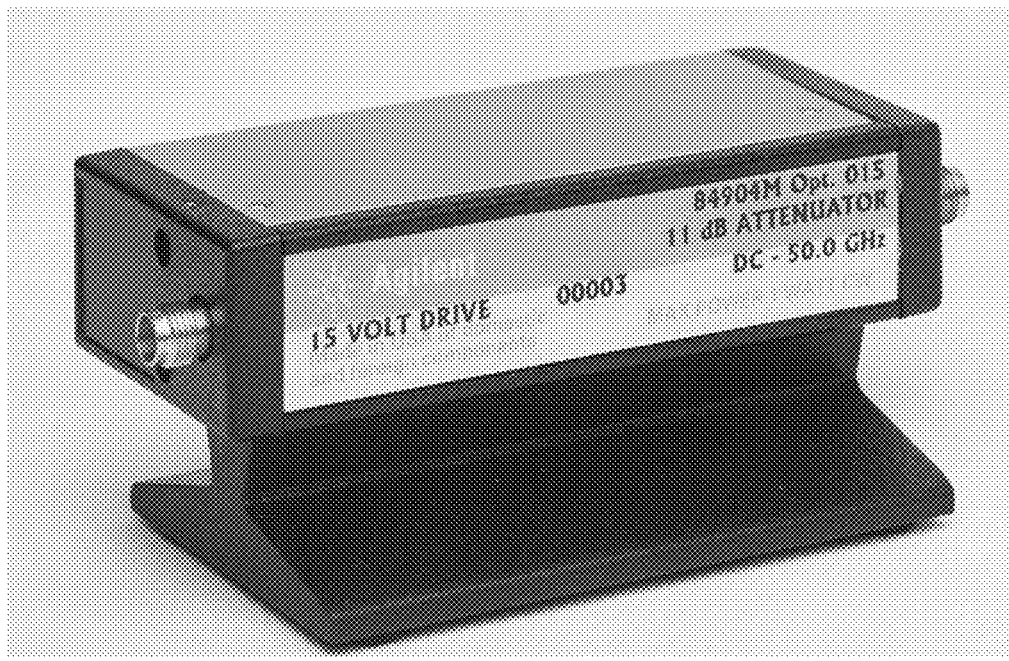
Figure 1: Prior art, wideband variable attenuator

Figure 2: Prior art, wideband variable phase shifter

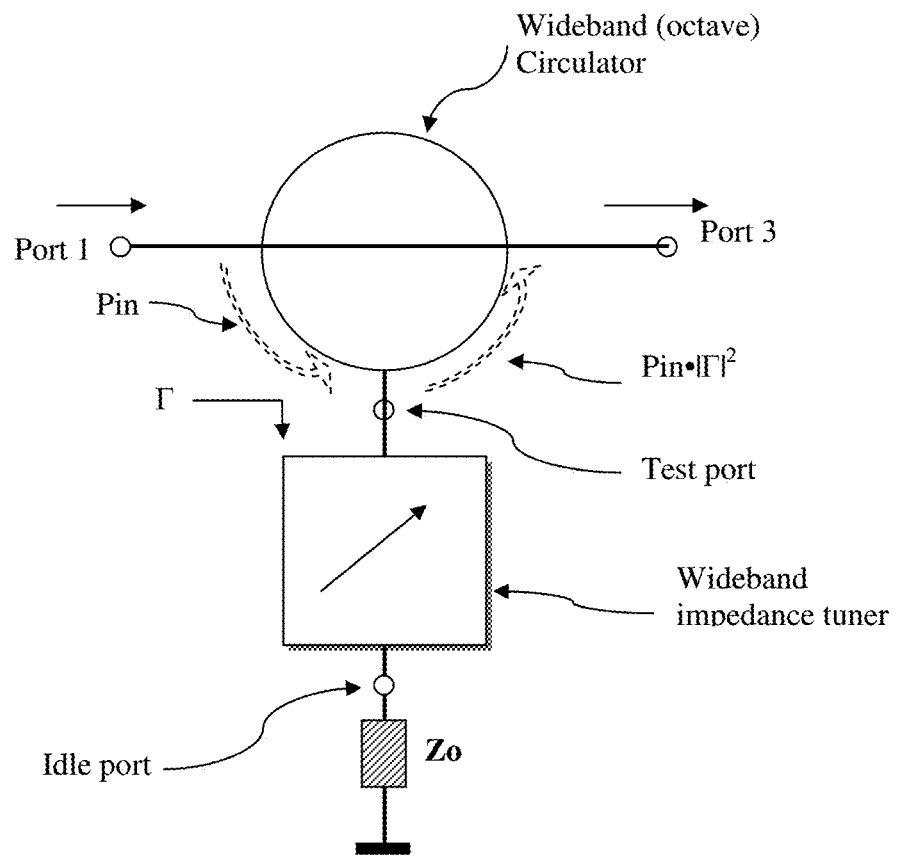
Figure 3: basic amplitude/phase modulator using circulator and wideband tuner

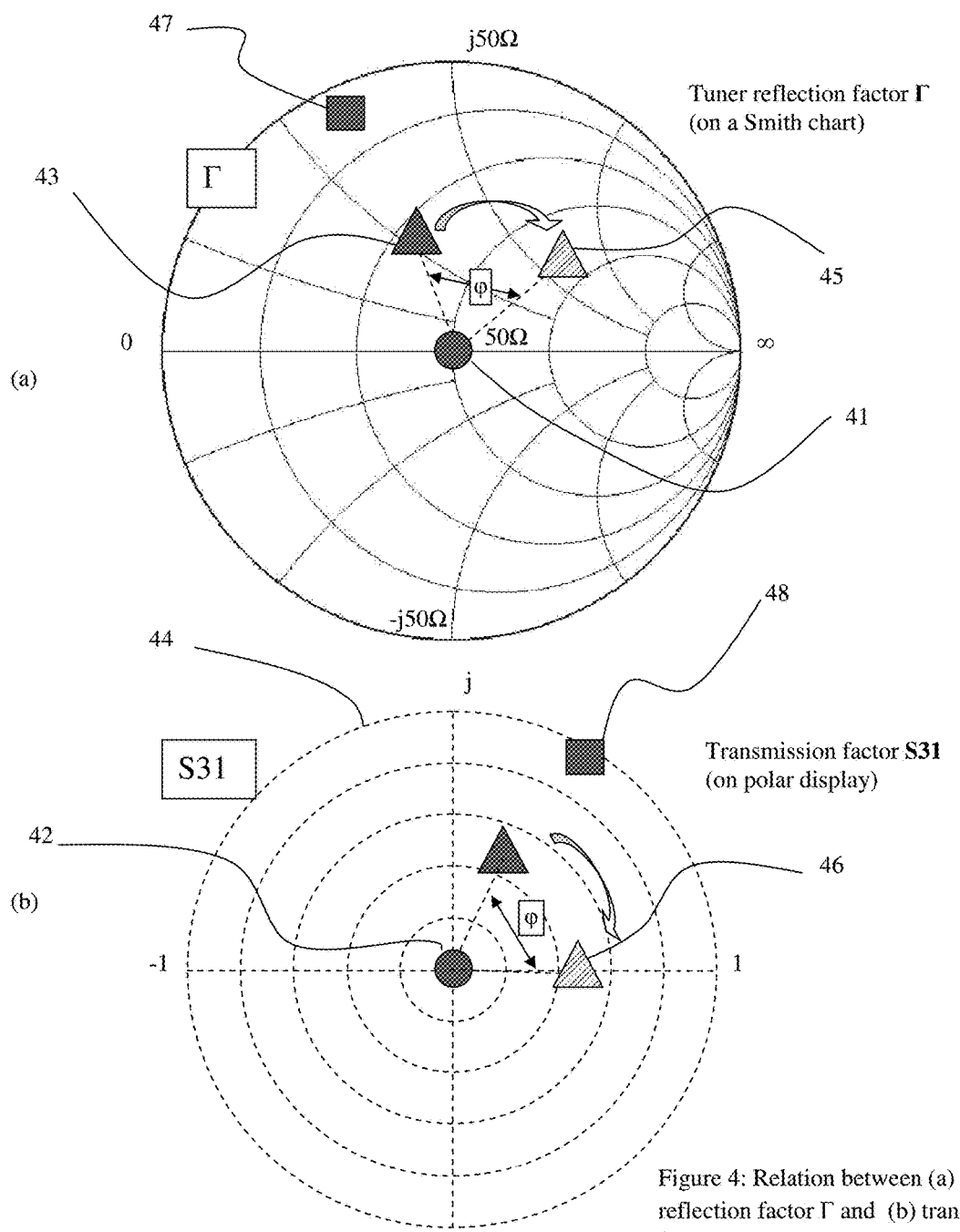
Figure 4: Relation between (a) tuner reflection factor Γ and (b) transmission factor S31

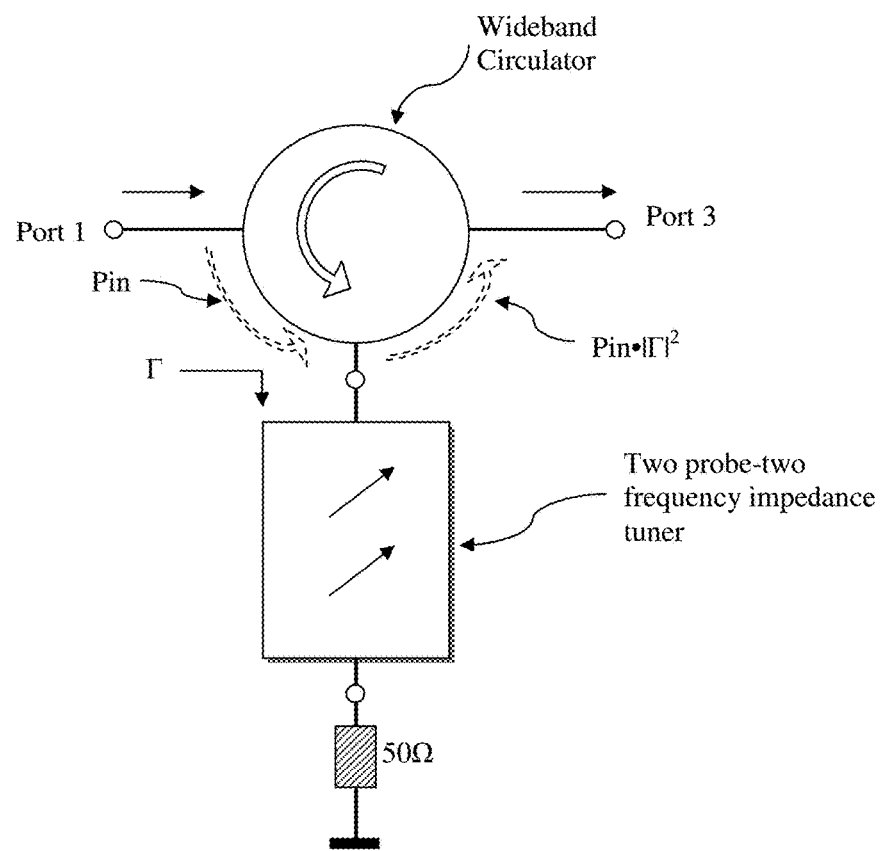
Figure 5: Octave band amplitude phase modulator (limited by circulator frequencies).

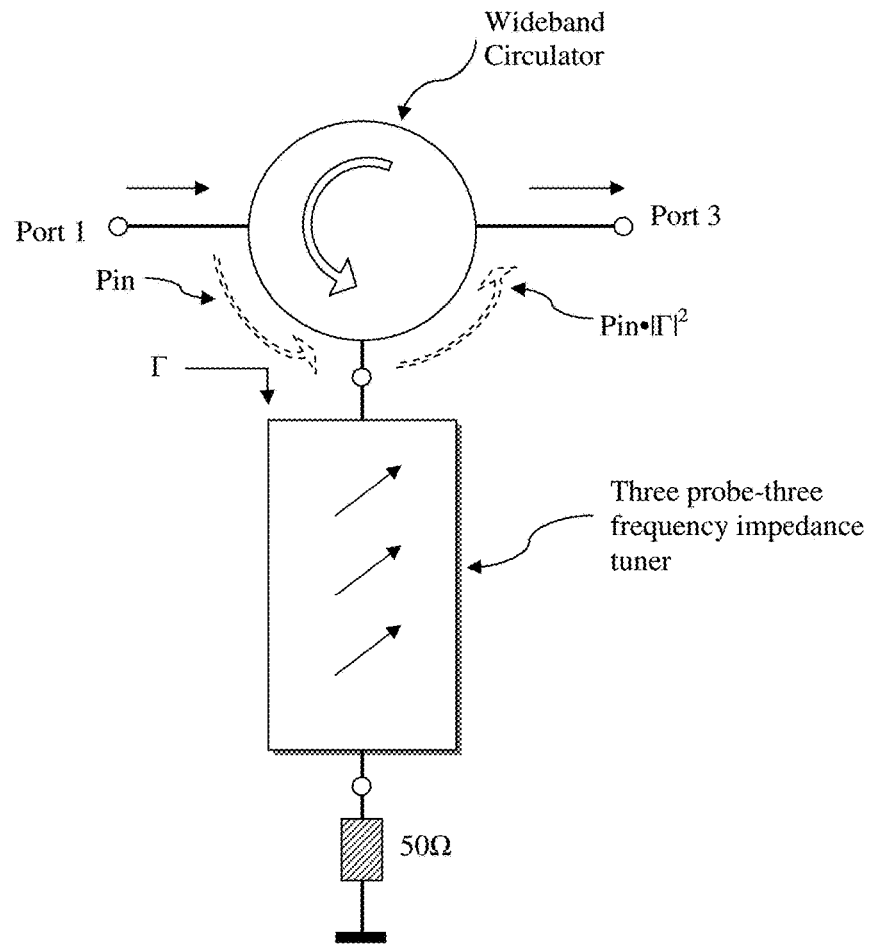
Figure 6: Octave band amplitude phase modulator (limited by circulator frequencies).

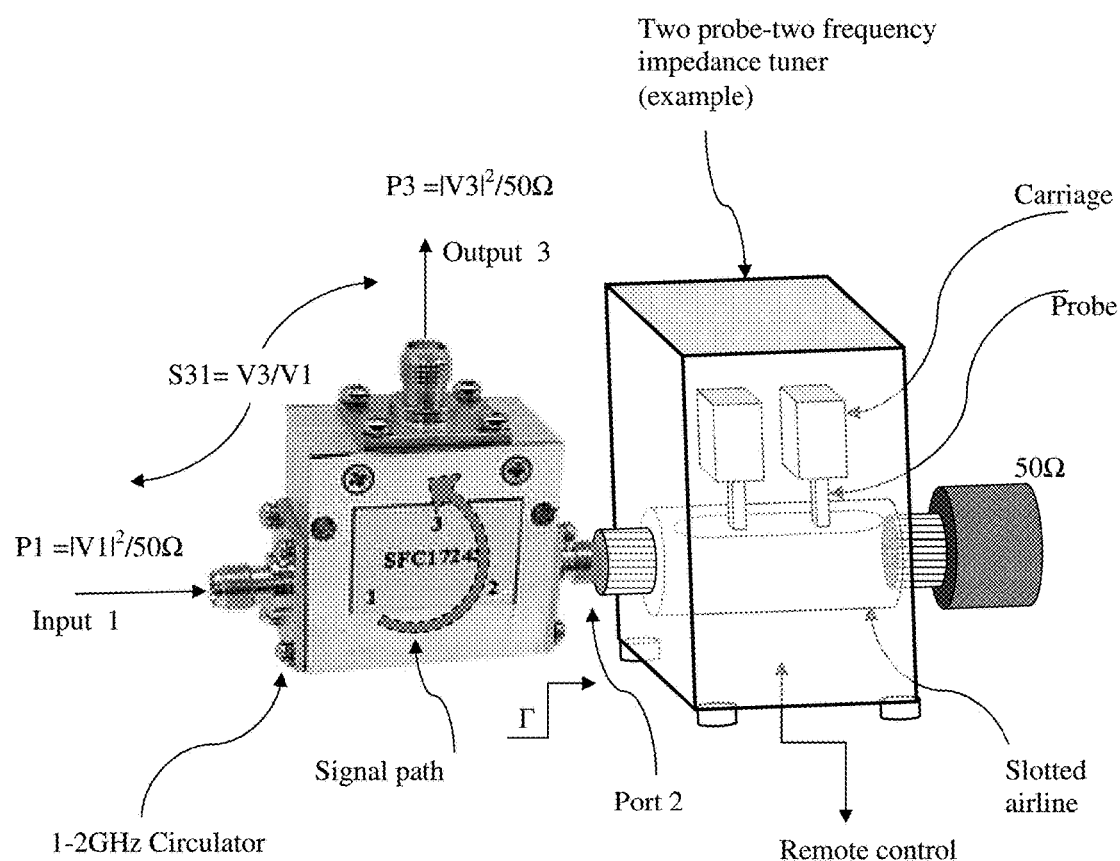
Figure 7: Actual implementation with commercial Circulator

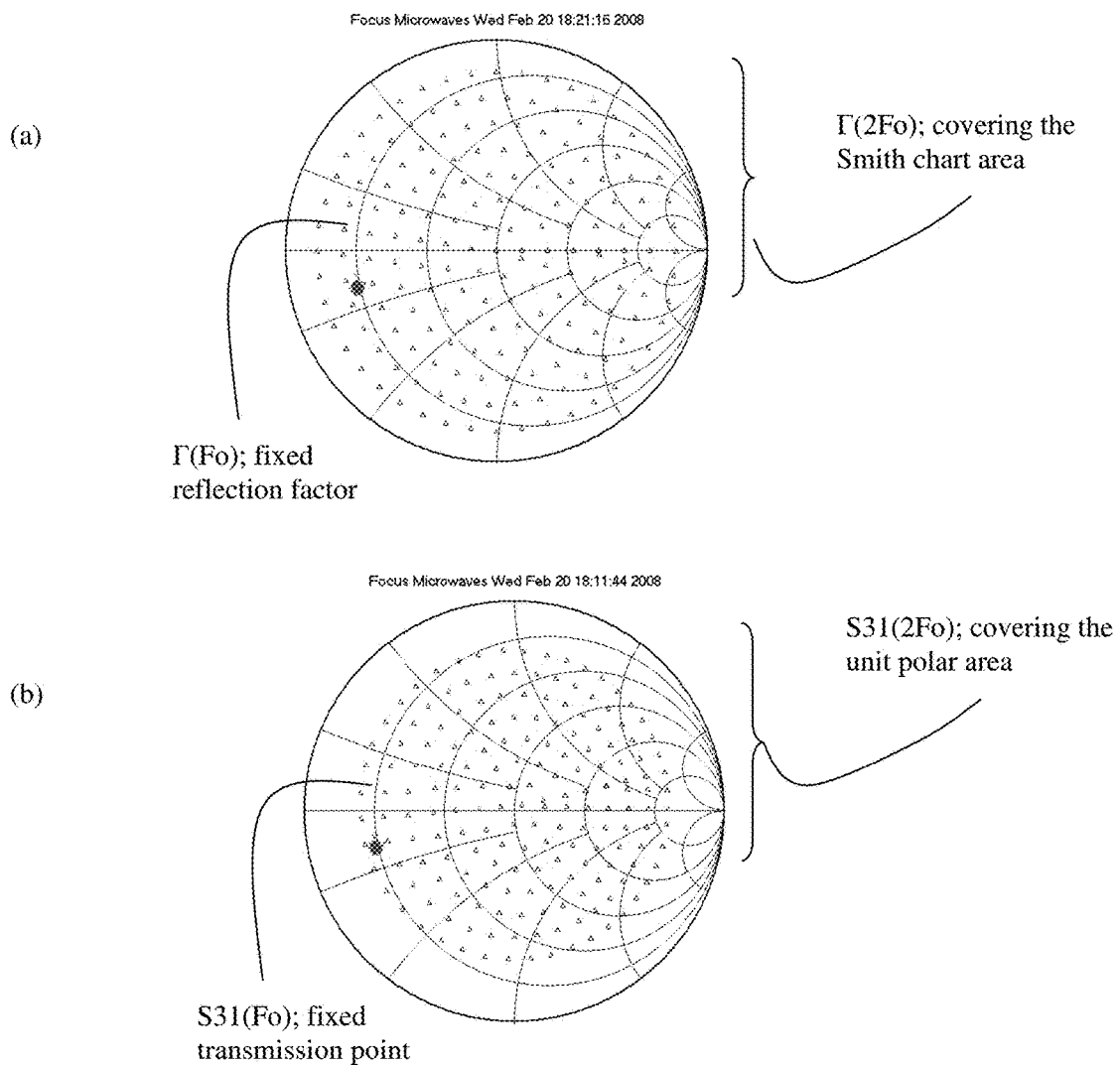
Figure 8: Control of transmission factor S31(2Fo) with S31(Fo)=constant

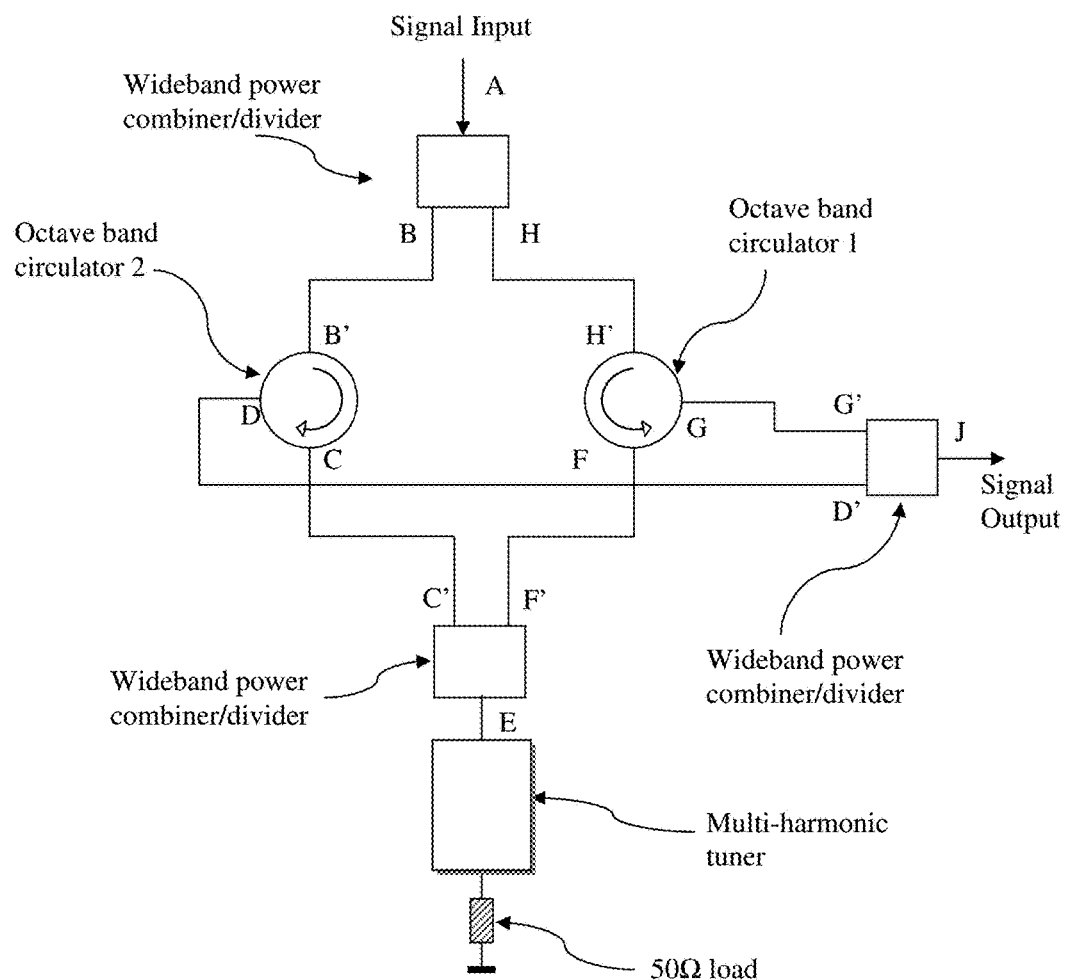
Figure 9: Wideband harmonic attenuator/phase shifter using only power dividers

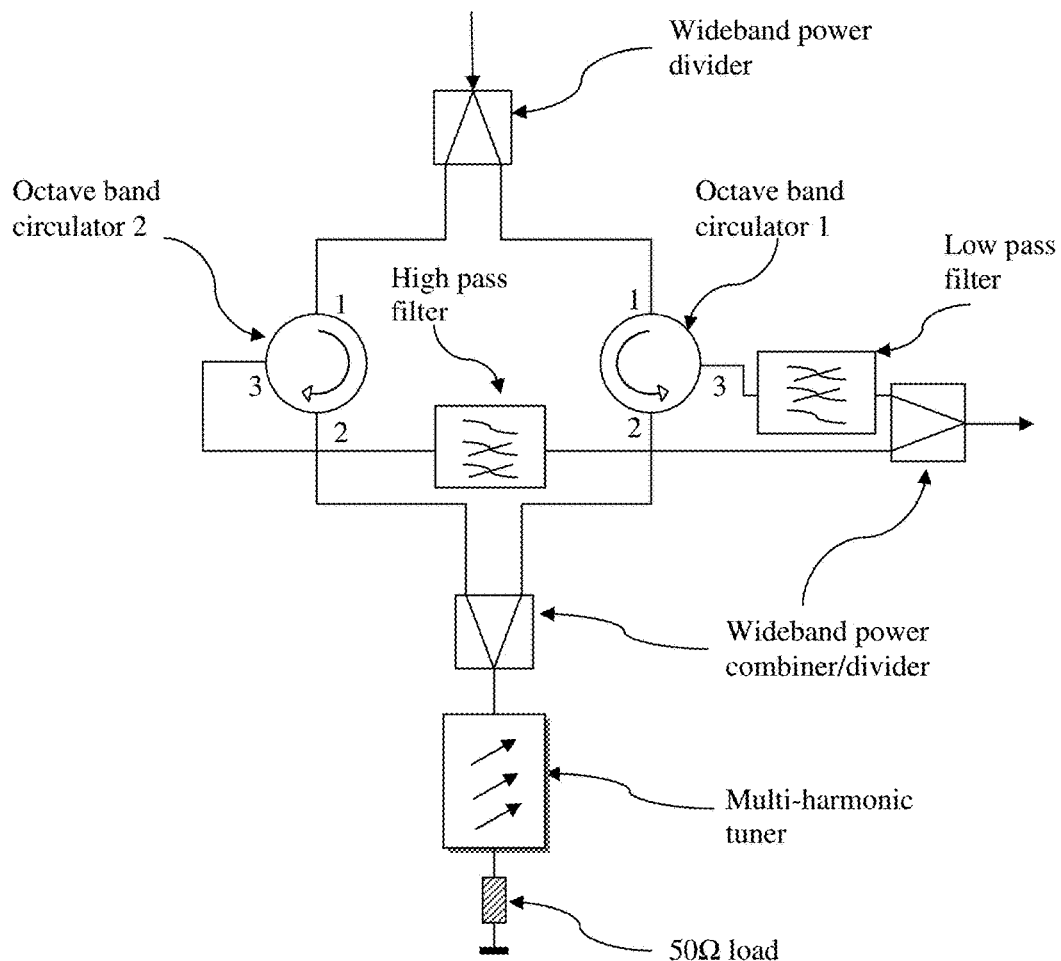
Figure 10: Wideband harmonic attenuator/phase shifter using LPF and HPF

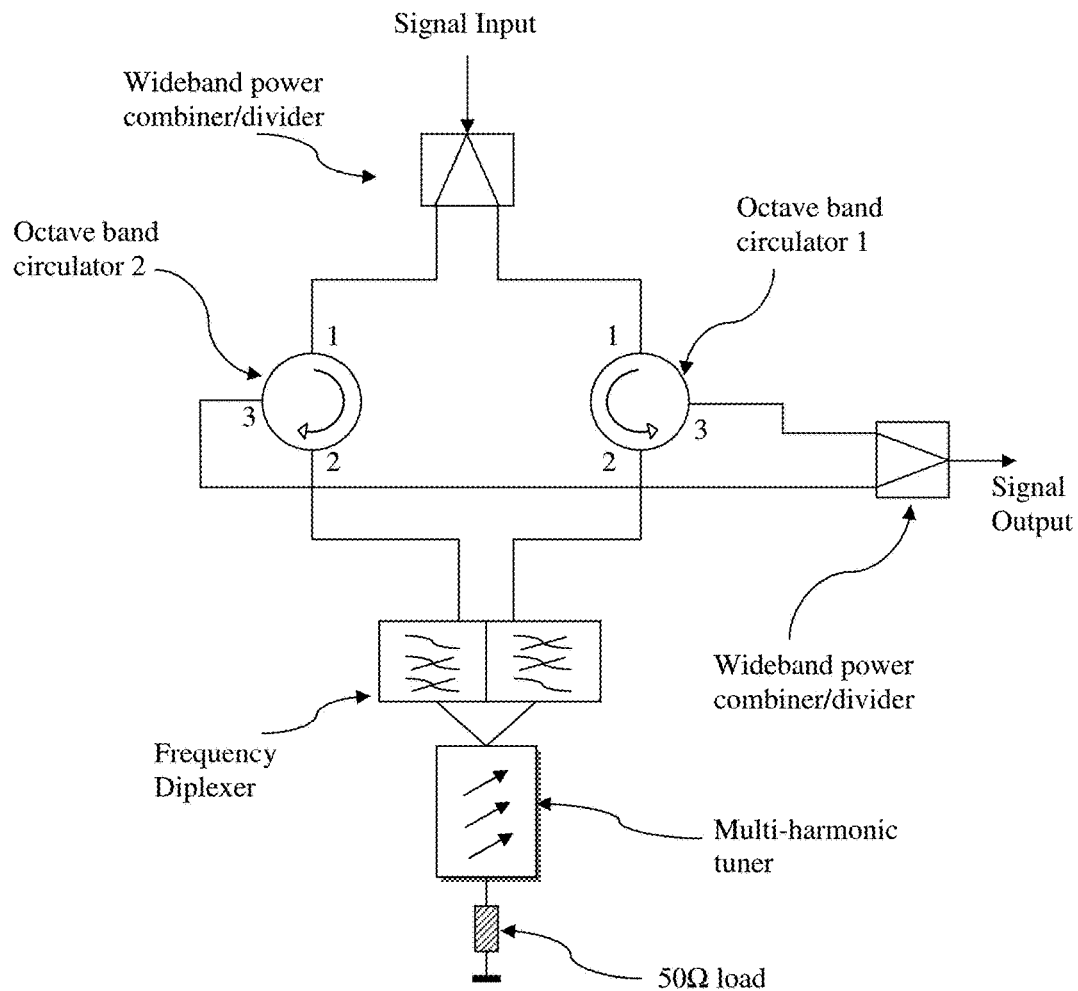
Figure 11: Wideband harmonic attenuator/phase shifter using frequency Diplexer

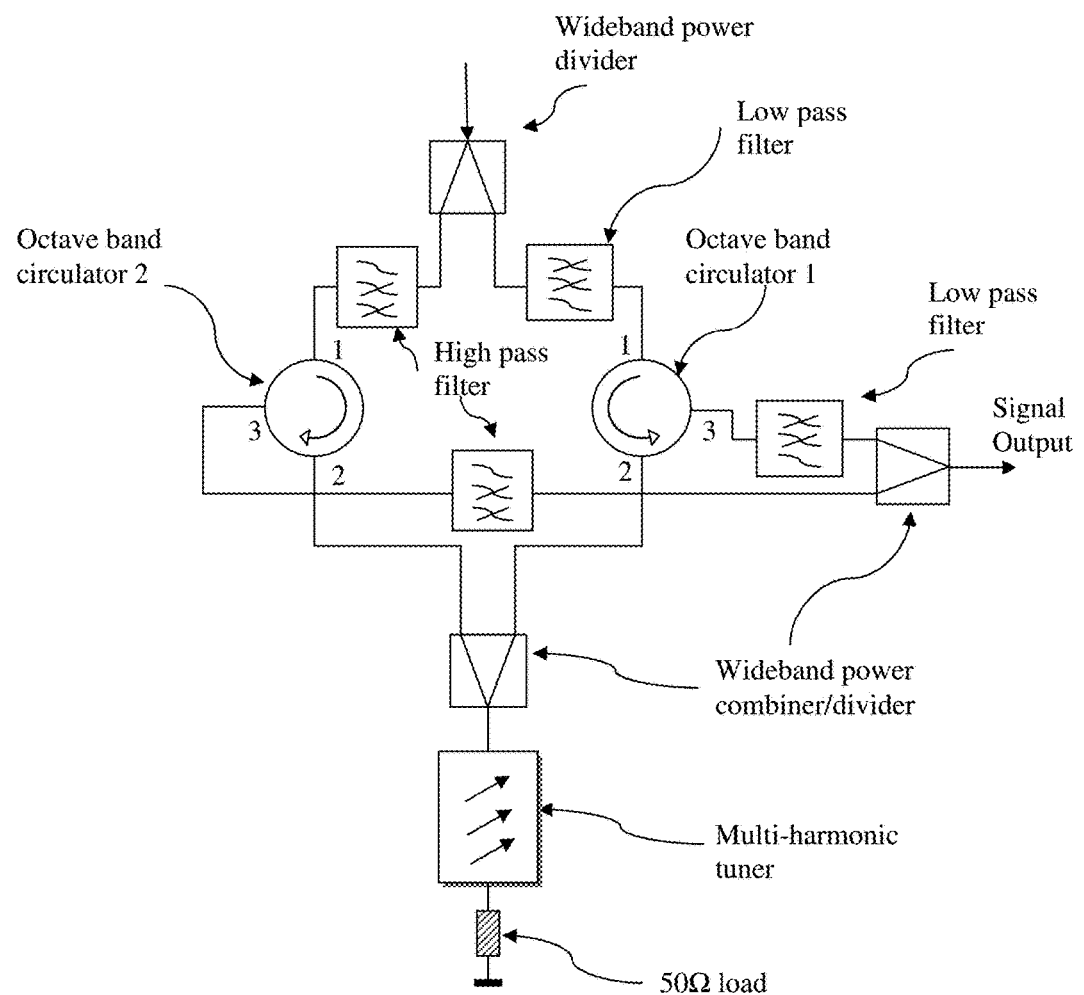
Figure 12: Wideband attenuator/phase shifter using four low pass/high pass filters

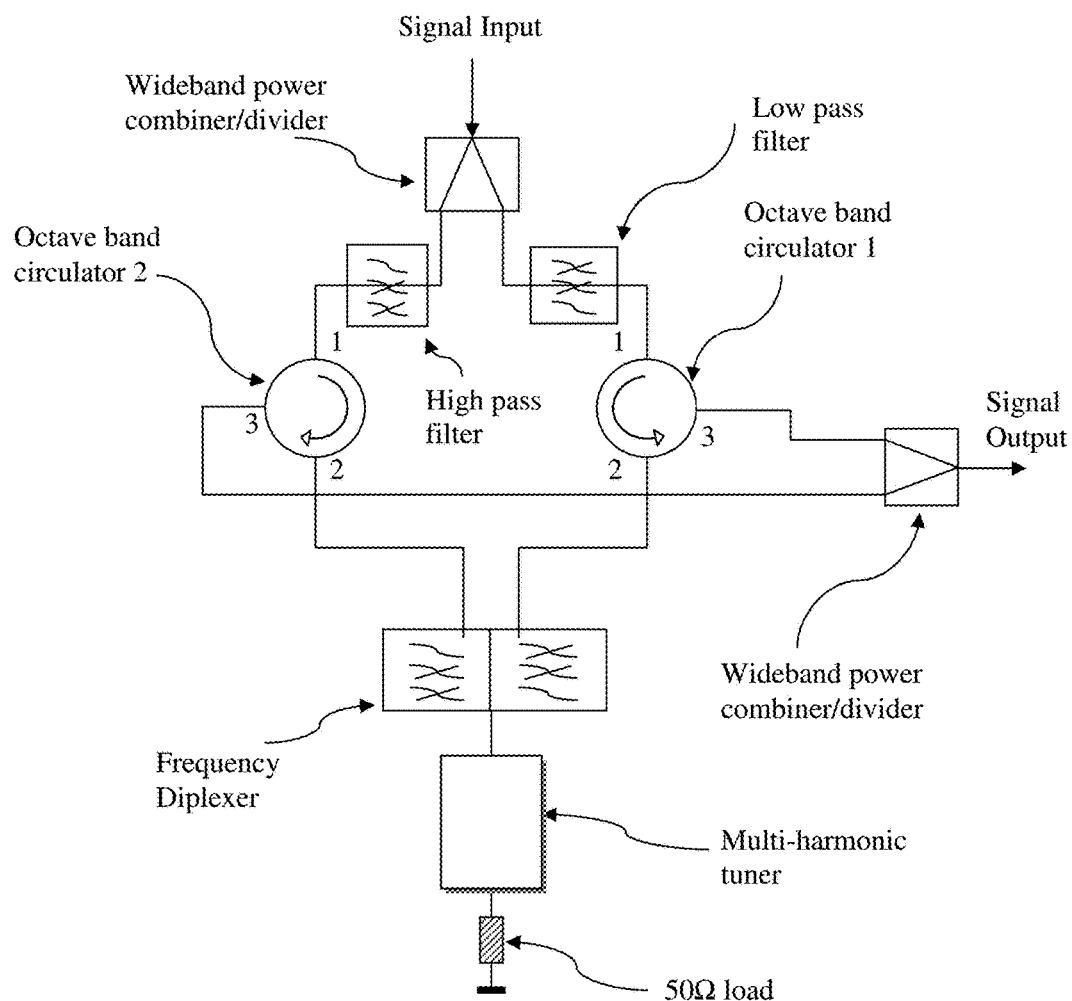
Figure 13: Wideband attenuator/phase shifter using a combination of low pass/high pass filters and frequency diplexer

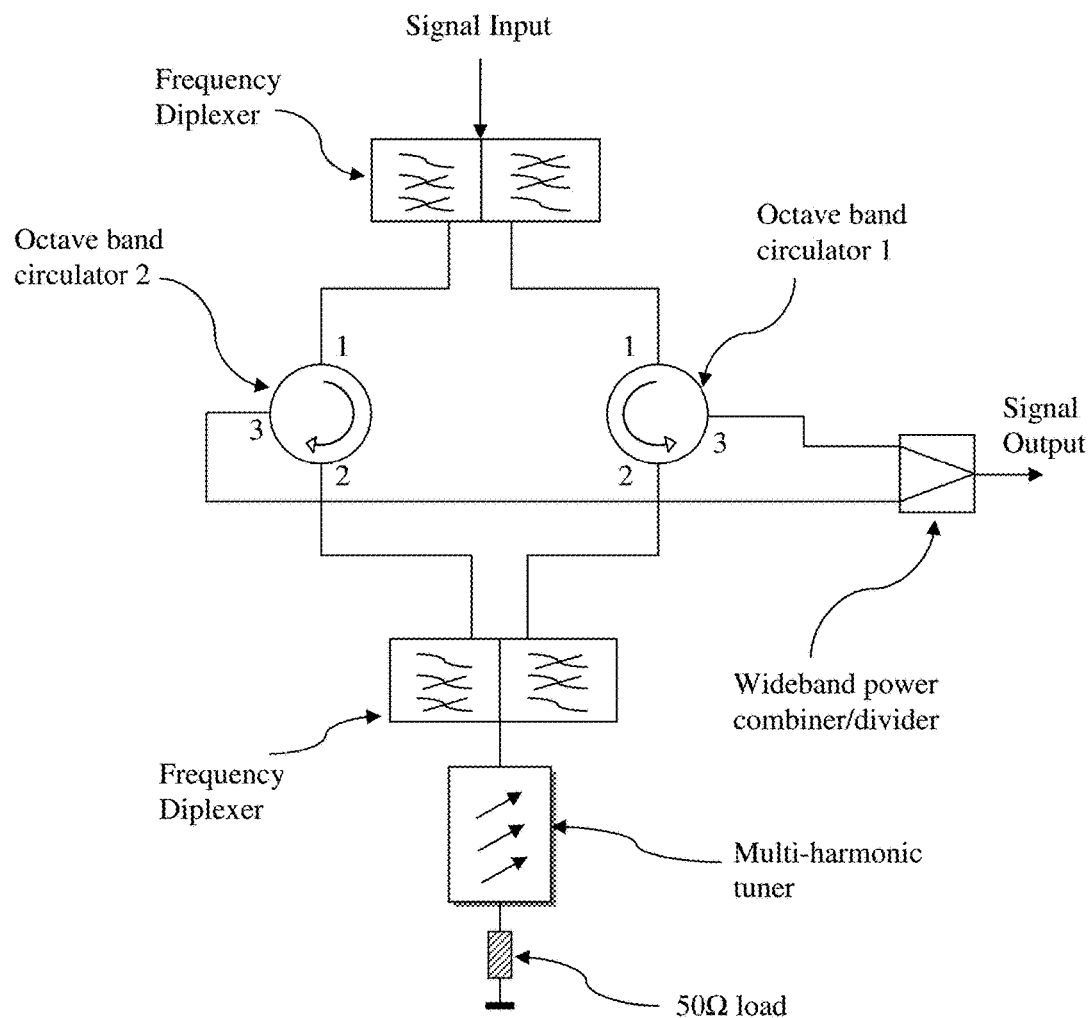
Figure 14: Wideband attenuator/phase shifter using two diplexers

MULTI-FREQUENCY ATTENUATION AND PHASE CONTROLLER

PRIORITY CLAIM

Not Applicable

CROSS-REFERENCE TO RELATED ARTICLES

[1] Load Pull System: http://www.microwaves101.com/encyclopedia/loadpull.cfm
[2] S-parameter Basics: http://www.microwaves101.com/encyclopedia/sparameters.cfm
[3] U.S. Pat. No. 6,674,293 Adaptable pre-matched tuner system and method
[4] U.S. Pat. No. 7,135,941 Triple probe automatic slide screw load pull tuner and method
[5] Coaxial Circulators: http://www.dpvrf.com/Coaxial_Circulators.html
[6] Directional Couplers: http://www.e-meca.com/rf-directional-coupler/directional-coupler-780.php
[7] Frequency Diplexers: http://www.markimicrowave.com/2781/Diplexers.aspx
[8] Low pass filters: http://www.markimicrowave.com/3448/Low_Pass_Filters.aspx
[9] MPT, a universal Multi-Purpose Tuner, Product Note 79, Focus Microwaves, October 2004
[10] Active load pull system: http://ieeexplore.ieee.org/xpl/freeabs_all.jsp?arnumber=1516920
[11] Harmonic Active Injection Load Pull, HAILP; datasheet, Focus Microwaves, 2011
[12] U.S. patent application Ser. No. 12/929,643: Method for Calibration and tuning with Impedance tuners
[13] Frequency Diplexers: http://en.wikipedia.org/wiki/Diplexer
[14] Wideband phase shifters: http://www.pasternack.com/phase-shifter-frequency-range-265-400-ghz-pe8249-p.aspx

BACKGROUND OF THE INVENTION—PRIOR ART

This invention relates to high power (nonlinear) testing of microwave transistors (DUT) in the frequency and time domain [1]. The electrical signals injected into the input of the DUT and extracted from the output can be measured using sampling devices, such as signal couplers [6]. At high power the (nonlinear) DUT is saturating and deforming the sinusoidal input signal. As a result part of the power is contained in harmonic frequency components. The DUT performance can only be optimized when all harmonic frequency components are impedance-matched properly. This requires independent harmonic tuning, mainly but not exclusively, at the DUT output.

Load pull is the method by which the load impedance presented to the DUT at a given frequency is changed systematically and the DUT performance is registered, with the objective to find an optimum depending on the overall design objectives [1]. This may be maximum power, efficiency, linearity or else. The same is valid for the source side of the DUT. Passive (slide screw) tuners are used to emulate the various impedances presented to the DUT [3]. Insertion loss in the signal path between the DUT and the tuner reduce the "tuning range" of the tuner and it often happens that the DUT cannot be matched properly, if its internal impedance cannot be reached by the tuner (reduced by the insertion losses of the transmission section between tuner and DUT). In these cases "active load pull systems" can be used [10].

Active load pull systems use amplifiers in an "open" or "closed" loop configuration to recover and re-inject part of the outgoing power into the DUT in order to generate a "virtual" load. Depending on the gain and power of the amplifiers in the loops the returning power can be equal or even higher than the outgoing power, so the virtual reflection factor $\delta$, defined as $|\Gamma|^2 = Pr/Pi$, where Pr is the power reflected by the load and Pi the power delivered by the DUT, presented to the DUT can be equal or even higher than 1. The subject of this invention is to introduce a component which allows controlling the amplitude and phase of the signals returned to the DUT by the "active" loop.

In the case of open loop active load pull systems there are, in principle, two ways for injecting signal power at controlled amplitude and phase into the DUT. One is by using external synchronized signal sources at the designated (harmonic) frequencies and the other is to use closed loops and control amplitude and phase individually [11]. This second option requires a "frequency selective amplitude and phase controller". Such an apparatus is presented here.

A device capable of controlling the amplitude and phase of signals in the microwave frequency range individually for a number of frequencies is not known. What is known are commercially available variable attenuators (FIG. 1) and phase shifters (FIG. 2). Whether those components are manually or remotely controlled is irrelevant. What is important is that they are "wideband"; this means the amplitude and phase of two signals with different frequencies going through those components cannot be controlled independently. This makes those components useless for the present application.

The present invention describes an apparatus that can do that; it can adjust, independently, the amplitude and phase of a number of signals at different frequencies passing through it.

DESCRIPTION OF THE DRAWINGS

The present invention will be better understood in view of the enclosed drawings of which FIG. 1 depicts prior art: a commercially available wideband variable attenuator.

FIG. 2 depicts prior art: a commercially available wideband variable phase shifter.

FIG. 3 depicts a basic (non-frequency selective) amplitude and phase modulator using a circulator and a wideband impedance tuner.

FIG. 4 a) and b) depict the tuner reflection factor and the associated modulator transmission factor of the apparatus in FIG. 3.

FIG. 5 depicts an octave band covering amplitude and phase modulator using an octave band circulator and a two-probe two-frequency impedance tuner.

FIG. 6 depicts an octave band covering amplitude and phase modulator using an octave band circulator and a three-probe three-frequency impedance tuner.

FIG. 7 depicts an actual implementation of an apparatus as described in FIG. 3.

FIG. 8 a) and b) depict measured results on the frequency selective control of the transmission factor S31 (Fo), created by the associated tuner reflection factor S11 (2Fo) or $\Gamma$(2Fo); note that when a twoport is terminated with the characteristic impedance (Zo=50$\Omega$), then S11=$\Gamma$.

FIG. 9 depicts a wideband (more than one octave) attenuator/phase modulator using two circulators, three power dividers/combiners and a three-probe multi frequency impedance tuner.

FIG. 10 depicts the implementation of the apparatus in FIG. 9, using additionally two high/low pass filters for better signal frequency band separation.

FIG. 11 depicts the implementation of the apparatus of FIG. 9, where one power combiner/divider is replaced by a frequency diplexer.

FIG. 12 depicts an implementation of the apparatus in FIG. 9, whereby high/low pass filters ensure better signal frequency band separation.

FIG. 13 depicts the implementation of the apparatus of FIG. 9, whereby high/low pass filters and a frequency diplexer ensure better signal frequency band separation.

FIG. 14 depicts the implementation of the apparatus of FIG. 9, whereby two power dividers are replaced by frequency diplexers for better signal frequency band separation.

DETAILED DESCRIPTION OF THE INVENTION

The proposed apparatus utilizes the capacity of wideband multi-carriage electro-mechanical impedance tuners to synthesize user defined reflection factors (impedances) covering the whole Smith chart for a number of frequencies individually and independently [3, 4, 9, 12]. The tuners have a test port and an idle port and are, typically, terminated at their idle port with the characteristic impedance (typically $Zo=50\Omega$) or an impedance close to it; their test port is connected to one port of a circulator (typically port 2), FIG. 3; the signal is injected into the previous circulator port, following the signal flow (typically port 1). In this case the signal frequencies are reflected ($\Gamma$) at the test port of the tuner and re-injected into port 2 to exit at the last circulator port (typically port 3).

The signal transmission factor A31 between port 1 and port 3 (FIG. 3) is then directly proportional to the reflection factor $\Gamma$ at port 2. Since the wideband tuner can synthesize any reflection factor $\Gamma(F)=|\Gamma|*\exp(j\phi)$ in amplitude and phase for any pre-calibrated frequency (F), within the tuning rang of the tuner, at will, so will do the complex transmission factor A31. A31 is defined as the ratio of the signal vector at port 3 ($V3=|V3|*\exp(j\phi 3)$) divided by the signal vector at port 1 ($V1=|V1|*\exp(j\phi 1)$):

$$A31=V3/V1=|V3|/|V1|*\exp(j(\phi 3-\phi 1)). \qquad \text{eq}(1)$$

If ports 1 and 3 are terminated with the characteristic impedance (Zo) then the general transmission factor A31 becomes (by definition) equal to the scattering parameter S31 (A31=S31) [2]. In network terms and in the case of a circulator, if the transmission parameter between ports 1 and 2 is S21 and between ports 2 and 3 is S32, and the reflection factor of the tuner, connected at port 2, is $\Gamma=|\Gamma|*\exp(j\phi)$, then the overall transmission parameter S31 is:

$$S31=S21*\Gamma*S32, \qquad \text{(eq. 2)}$$

or $$|S31|=|S21|*|\Gamma|*|S32|$$

and $$\phi 31=\phi 21+\phi+\phi 32 \qquad \text{(eq. 3)}$$

Equations (2) and (3) are valid only in case of circulators and inside the operation frequency of the circulators, since in this case the reverse transmission factors are equal to or close to zero: $S12\approx S23\approx S13\approx 0$, whereas in the forward direction their amplitudes are all close to one: $|S21|\approx|S32|\approx|S31|\approx 4$.

Since both amplitude and phase of the transmission s-parameters S21 and S32 of the circulators are component-specific and not affected by the tuner movement, then it is obvious that the amplitude and phase of the overall transmission S31 depends only of $\Gamma=|\Gamma|*\exp(j\phi)$, whereas $|\Gamma|$ is the magnitude and $\phi$ the phase of the reflection factor at the tuner test port (connected to port 2 of the circulator, FIG. 3). Therefore for frequencies inside the operation bandwidth of a typical circulator the apparatus is providing the expected result (FIG. 4). FIG. 4a) shows the reflection factor which the tuner presents connected to port 2 of the circulator and FIG. 4b) shows the associated transmission factor S31. A reflection factor of zero (41) generates a transmission factor of zero as well (42); this is because all power injected into port 1 of the circulator and transmitted to port 2 is absorbed by the characteristic impedance Zo seen through the tuner, since the probes of said tuner are fully withdrawn and the tuner represents, in that case, a simple transmission line. A medium level reflection factor (43) creates a medium level transmission factor (44) as well; shifting the reflection factor (43) to (45) by moving the tuner probes horizontally along the axis of the slabline, also shifts the transmission factor (44) to (46) by the same angle. A maximum tuner reflection factor (47) generates also a maximum transmission factor (48). Because of this equivalence calibrating the amplitude/phase controller is following the same algorithms and may use the same interpolation and tuning routines as the prior art impedance tuners themselves [3, 4, 12].

Circulators are components based on the anisotropy of magnets incorporated in them which attenuate the electromagnetic field according to its polarization. Therefore the RF signal passes only in one direction (forward) and is attenuated, by a typical factor between 100 (20 dB) and 1000 (30 dB) in the opposite direction. Available circulators cover typically one octave (Fmax/Fmin=2) or less, especially at frequencies below 1 GHz. At higher frequencies octave bandwidths or even slightly more are available [5].

For applications where harmonic tuning is required, such as harmonic load pull, a standard octave band circulator will, therefore, allow operation only at the limits of its frequency range. For instance, a 2-4 GHz circulator will allow harmonic tuning only at Fo=2 GHz and 2Fo=4 GHz (FIGS. 5, 7). Any frequency other than 2 GHz will not be operational. This is an important limitation. First of all tuning is typically required at 3Fo as well. Secondly most harmonic tuning applications are not identical with the typically available circulator octave bands. If Fo will be covered probably 2Fo and 3Fo will not. To solve this problem alternative configurations are needed. The apparatus of FIG. 6, whereas it can control up to three frequencies independently, as far as they are inside the bandwidth of the circulator, it cannot control more than two harmonic frequencies, because of the circulator limitations, and this only when Fo and 2Fo fall exactly at the operation limits of the circulators. FIG. 8a) shows the tuner reflection factor and FIG. 8b) the transmission factor at Fo and 2Fo in an application, in which the two-harmonic tuner in FIG. 7 controls independently amplitude and phase of the transmission factor S31(Fo) and S31(2Fo). Whereas S31(Fo) can be kept constant, S31(2Fo) can be tuned to any area of the Smith chart (within the "tuning" range of the tuner). In this case Fo and 2Fo are chosen to be at the operation limits of the octave band circulator used (Fo=2 GHz, 2Fo=4 GHz).

To overcome the bandwidth limitations of circulators, alternative configurations require the use of octave band circulators in parallel, where the signal is split and injected into the adjacent circulators before reaching the wideband harmonic tuner (FIGS. 9-14). Assuming two octave band circulators, such as 2-4 GHz and 4-8 GHz, the new configurations will be able to process signals from Fo=2 GHz to 4 GHz for controlling Fo and 2Fo or from 2 GHz to 2.66 GHz for controlling Fo, 2Fo and 3Fo. This approach is valid throughout the frequency range of available circulators [5]. In order to do so the RF signal must be split before reaching the adjacent circulators, be combined before reaching the test port of the multi-probe tuner, then be split again before being injected into the second port of the circulators and finally be re-combined at the output of the network (FIGS. 9-14). The frequency splitting can be performed either using the frequency selective transmission behavior of the circulators (FIG. 9), which is not a very effective approach, or (more effectively, but also more coumbersome and expensive) by using low-pass/high-pass filter combinations or frequency diplexers ([7, 8, 13], FIGS. 10-14). For ultra-wideband applications additional frequency separation branches can be used, such as splitting the high frequency branch in two using additional filters/diplexers or using frequency triplexers to start with.

All configurations (FIGS. 9-14) operate on the same principle; using the schematics of FIG. 9: the incoming signals (A) are separated in bandwidths associated with the bandwidths of the following circulators (B, H). The corresponding signals then enter ports (B', H') of said circulators and exit ports (C, F) of the same. Then said signals are combined through power combiners (C', F') into the test port of a wideband multi-harmonic tuner (E), which reflects each signal frequency Fi with a distinct, user defined, reflection factor $\Gamma(Fi)$, preset at port E; then the reflected signal follows its way back through the combiner into the ports (from E to C'/C, and from E to F'/F) of the associated circulators, and exit from said circulators at ports (D/D', G/G'). The signals arriving at (D', G') from both circulators are then combined into the output port (J). Alternative configurations, in which combiners are replaced by combinations of low/high pass filters and/or frequency diplexers, are preferable from the point of view of better RF performance, but more complex and costly (FIGS. 10-14); in any case the principle is the same.

Using frequency discriminators/filters in FIGS. 10-14 improve the practical separation among bands but they are themselves frequency limited. Using wideband power combiners/dividers relies on the frequency selectivity of said circulators, which may be insufficient to avoid signal combinations at the output and cross interference. This can only be decided, however, on a case by case situation, after the circulators have been fully characterized in view of the harmonic frequencies to be used and a cost/performance analysis has been carried through.

The invention describes the concept of a multi-frequency variable attenuator and phase shifter, in which each frequency is controlled independently; the concept has been shown experimentally also for one and two frequencies as well as for harmonic frequencies; the concept has been described in a number of embodiments; obvious alterations shall not limit or affect the validity of the innovation.

What I claim is:

1. A microwave apparatus having an input and an output port,
   whereby said apparatus controls the amplitude and phase of signal transmitted from its input port to its output port,
   said apparatus comprising:
   a 3-port circulator having ports #1, #2 and #3,
   whereby the signal flows from port #1 to port #2, from port #2 to port #3 and from port #3 to port #1; and
   a slide screw impedance tuner having a test port and an idle port, a slabline between the ports having a characteristic impedance Zo and at least one mobile carriage, moving along the slabline and having vertical axis inserting or withdrawing a reflective probe into the slabline;
   whereby port #1 of the circulator is the input port of the apparatus and port #3 is the output port of the apparatus;
   and whereby the test port of the tuner is connected to port #2 of the circulator, and the idle port of the tuner is terminated with Zo;
   hereby the signal injected into port #1 of the circulator exits from port #2 and is reflected at the test port of the tuner, which controls the amplitude and phase of the reflection factor at the test port; the reflected signal returns into port #2 and from there it is transferred to port #3 and exits the apparatus.

2. The apparatus of claim 1, whereby the tuner is a single probe wideband tuner, capable of controlling the reflection factor at a single frequency.

3. The apparatus of claim 2, whereby controlling the amplitude and phase of one frequency component of RF signal transmitted from input to output port by adjusting the reflection factor created by the impedance tuner at its test port.

4. The apparatus of claim 1, whereby the tuner is a two-probe tuner, capable of controlling, independently, the reflection factor at two frequencies.

5. The apparatus of claim 4, whereby controlling the amplitude and phase of two frequency components of RF signal transmitted from input to output port by adjusting the reflection factor created by the impedance tuner at its test port at two selected frequencies.

6. The apparatus of claim 1, whereby the tuner is a three-probe tuner, capable of controlling, independently, the reflection factor at three frequencies.

7. The apparatus of claim 6, whereby controlling the amplitude and phase of three frequency components of RF signal transmitted from input to output port by adjusting the reflection factor created by the impedance tuner at its test port at three selected frequencies.

8. A microwave apparatus having an input and an output port,
   whereby the apparatus controls the amplitude and phase of signal transmitted from its input port to its output port,
   said apparatus comprising:
   three power combiners #1, #2 and #3, each having one input and two output ports, and
   one low frequency 3-port circulator #1 and
   one high frequency 3-port circulator #2,
   each 3-port circulator having ports #1, #2 and #3,
   whereby the signal flows from port #1 to port #2, from port #2 to port #3 and from port #3 to port #1; and
   an impedance tuner having a test port and an idle port and a slabline between the ports having a characteristic impedance Zo and multiple mobile carriages, moving along the slabline and having a vertical axis each inserting or withdrawing a reflective probe into the slabline;

whereby the input port of combiner #1 is the input port of the apparatus and the output port of combiner #3 is the output port of the apparatus; and whereby output port #1 of combiner #1 is connected to port #1 of circulator #1, and port #2 of circulator #1 is connected to input port #1 of combiner #2 and port #2 of circulator #2 is connected to input port #2 of combiner #2;

and whereby the output port of combiner #2 is connected to the test port of the multi-carriage tuner, whereby the idle port of the tuner is terminated with characteristic impedance Zo, and whereby port #3 of circulator #1 and port #3 of circulator #2 are connected to input port #1 and input port #2 of combiner #3 correspondingly;

hereby the signals are injected into the input port of combiner #1, the signals exiting from the output ports of combiner #1 are injected into the corresponding ports #1 of circulators #1 and #2, then the signals exiting from ports #2 of circulators #1 and #2 are combined by combiner #2 and reflected at the test port of the multi-probe tuner back into ports #2 of the circulators, are extracted from ports #3 of circulators #1 and #2, and are injected into combiner #3 where they are combined and extracted at the output port of the apparatus.

9. The apparatus of claim 8, whereby a low pass filter is inserted between output port #1 of combiner #1 and port #1 of circulator #1;

and a high pass filter is inserted between output port #2 of combiner #1 and port #1 of circulator #2.

10. The apparatus of claim 9, whereby the combiners are replaced by frequency diplexers.

11. The apparatus of claim 9, whereby a low pass filter is inserted between port #3 of circulator #1 and one input port of combiner #3 and a high pass filter is inserted between port #3 of circulator #2 and the other port of combiner #3.

12. The apparatus of claim 9, whereby a low pass filter is inserted between port #2 of circulator #1 and one input port of combiner #2 and a high pass filter is inserted between port #2 of circulator #2 and the other port of combiner #2.

* * * * *

UNITED STATES PATENT AND TRADEMARK OFFICE
CERTIFICATE OF CORRECTION

PATENT NO. : 9,835,652 B1
APPLICATION NO. : 13/896764
DATED : December 5, 2017
INVENTOR(S) : Christos Tsironis It is certified that error appears in the above-identified patent and that said Letters Patent is hereby corrected as shown below:

On the Title Page

Delete the title page and substitute therefore with the attached title page consisting of the corrected illustrative figure.

In the Drawings

Figure 3 should be replaced with the corrected Figure 3 as shown on the attached drawing sheet.

Signed and Sealed this
Fifteenth Day of May, 2018

Andrei Iancu
*Director of the United States Patent and Trademark Office*

United States Patent
Tsironis

(10) Patent No.: US 9,835,652 B1
(45) Date of Patent: Dec. 5, 2017

(54) MULTI-FREQUENCY ATTENUATION AND PHASE CONTROLLER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 1138 days.

(21) Appl. No.: 13/896,764

(22) Filed: May 17, 2013

(51) Int. Cl.
 *G01R 1/20* (2006.01)

(52) U.S. Cl.
 CPC .................................. *G01R 1/20* (2013.01)

(58) Field of Classification Search
 CPC ......... H01L 22/34; G01S 7/023; G01R 29/26; G01R 19/0053
 USPC ......... 324/500, 520–524, 750.01, 600, 616, 324/76.11, 216, 637, 639
 See application file for complete search history.

(56) References Cited

U.S. PATENT DOCUMENTS

| | | | |
|---|---|---|---|
| 6,674,293 B1 | 1/2004 | Tsironis | |
| 7,135,941 B1 | 11/2006 | Tsironis | |
| 8,497,689 B1* | 7/2013 | Tsironis | G01R 27/32 324/637 |
| 2012/0274425 A1 | 11/2012 | Mung | H01P 1/38 333/24 R |
| 2013/0321092 A1* | 12/2013 | Simpson | H03H 11/30 333/17.3 |

OTHER PUBLICATIONS

Load Pull System, www.microwaves101.com/encyclopedia/loadpull.cfm.
S-Parameter Basics, www.microwaves101.com/encyclopedia/sparameters.cfm.
Coaxial Circulators, www.dpvrf.com/coaxial_circulators.html.
Directional Couplers, www.e-meca.com/rf-directional-coupler/directional-coupler-780.php.
Frequency Diplexers, www.markimicrowave.com/2781/diplexers.aspx.
Low Pass filters, www.markimicrowave.com/3448/Low_Pass_Filters.aspx.
MPT, a universal Multi-Purpose Tuner, Product Note 79, Focus Microwaves Inc. Oct. 2004.
Active Load Pull System, http://ieeexplore.ieee.org/xpl/freeabs_all.jsp?arnumber=1516929.
Harmonic Active Injection Load Pull, HAILP, datasheet, Focus Microwaves Inc., 2011.
Method for Calibration and Tuning with Impedance tuners, U.S. Appl. No. 12/929,643, filed Aug. 2008.
Frequency Diplexers, http://en.wikipedia.org/wiki/diplexer.
Wideband phase shifters, www.pasternack.com/phase-shifters-frequency-range-265-400-ghz-ps8249-p.aspx.

\* cited by examiner

*Primary Examiner* — Melissa Koval
*Assistant Examiner* — Trung Nguyen

(57) ABSTRACT

A multi-frequency programmable and remotely controllable variable attenuator and phase shifter (MF-VAPS) network utilizes wideband three port circulators, power combiners, high-low pass filters and a calibrated multi-harmonic tuner to control the amplitude and phase of the transmission factor (A21) at up to three user defined frequencies individually. The harmonic signal components are divided in frequency bands and injected into the circulator's port 1 and extracted from port 3, whereas the tuner is connected to port 2 and terminated with Zo. When the tuner is initialized (S11=0) the transmission factor of the network is zero; when the tuner is at maximum reflection at any frequency the transmission factor is also maximum. Changing the reflection phase of the tuner controls the transmission phase <A21 by the same amount, up to 360°.

12 Claims, 14 Drawing Sheets

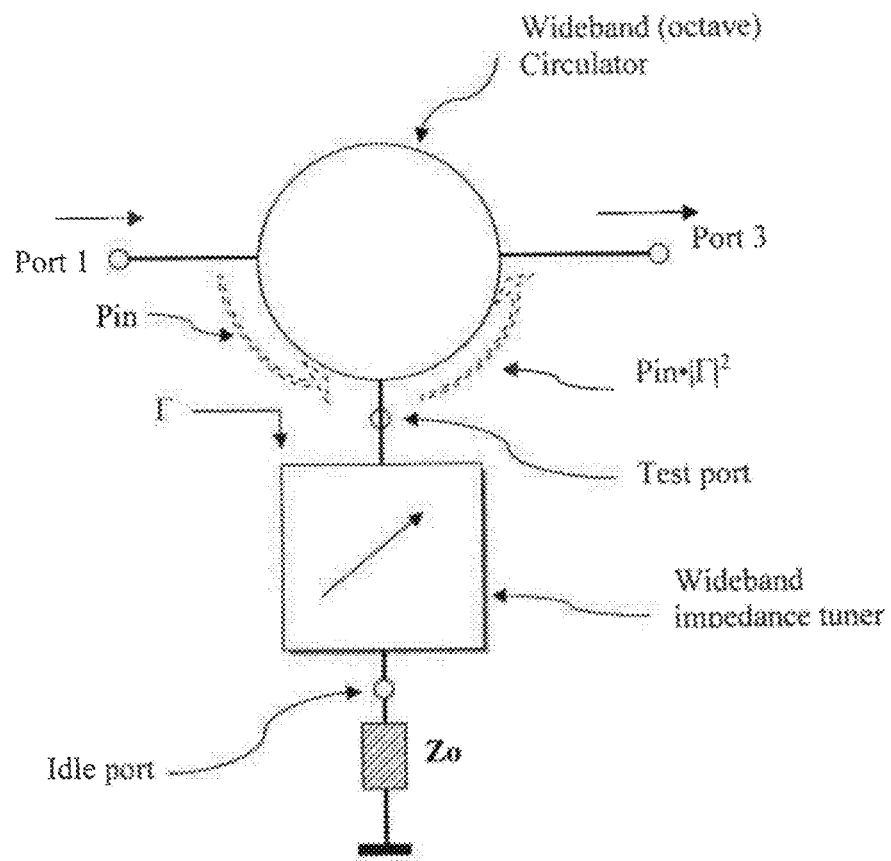
Figure 3: basic amplitude/phase modulator using circulator and wideband tuner